United States Patent
Lovett

[11] Patent Number: 5,889,416
[45] Date of Patent: Mar. 30, 1999

[54] SYMMETRICAL NAND GATES

[75] Inventor: Simon J. Lovett, Milpitas, Calif.

[73] Assignee: Cypress Semiconductor Corporation, San Jose, Calif.

[21] Appl. No.: 958,500

[22] Filed: Oct. 27, 1997

[51] Int. Cl.$^6$ .......................... H03K 19/20; H03K 19/094
[52] U.S. Cl. .......................... 326/121; 326/112; 326/119
[58] Field of Search ........................ 326/121, 21, 112, 326/119, 29

[56] References Cited

U.S. PATENT DOCUMENTS

| | | | |
|---|---|---|---|
| 3,900,742 | 8/1975 | Hampel et al. | 326/121 |
| 4,286,174 | 8/1981 | Dingwall . | |
| 4,429,375 | 1/1984 | Kobayashi et al. | 365/240 |
| 4,638,187 | 1/1987 | Boler . | |
| 4,716,308 | 12/1987 | Matsuo et al. | 326/121 |
| 4,736,123 | 4/1988 | Miyazawa et al. . | |
| 4,791,323 | 12/1988 | Austin . | |
| 4,857,763 | 8/1989 | Sakurai et al. . | |
| 4,877,978 | 10/1989 | Platt . | |
| 4,893,281 | 1/1990 | Hashimoto | 365/230.06 |
| 4,978,905 | 12/1990 | Hoff et al. | 323/314 |
| 5,057,715 | 10/1991 | Larsen et al. . | |
| 5,136,182 | 8/1992 | Fawal . | |
| 5,157,284 | 10/1992 | O'Connell et al. . | |
| 5,187,388 | 2/1993 | Moy | 326/121 |
| 5,274,277 | 12/1993 | Chan | 326/21 |
| 5,305,282 | 4/1994 | Choi | 365/230.08 |
| 5,386,153 | 1/1995 | Voss et al. | 326/34 |
| 5,493,530 | 2/1996 | Lee et al. | 365/189.05 |
| 5,526,320 | 6/1996 | Zagar et al. | 365/233.5 |
| 5,552,723 | 9/1996 | Shigehara et al. | 326/86 |
| 5,587,964 | 12/1996 | Rosich et al. | 365/238.5 |
| 5,625,302 | 4/1997 | Covino et al. | 326/93 |
| 5,654,651 | 8/1997 | Kaneko et al. | 326/121 |

FOREIGN PATENT DOCUMENTS

| | | | |
|---|---|---|---|
| 363310213 | 12/1988 | Japan | 326/121 |
| 3132115 | 6/1991 | Japan . | |
| 567964 | 3/1993 | Japan . | |
| 406224739 | 8/1994 | Japan | 326/121 |

OTHER PUBLICATIONS

Lovett (Applicant), Patent Application Ser. No. 08/958500, admitted prior art on p. 5, Oct. 1997.

Primary Examiner—Michael Tokar
Assistant Examiner—Daniel D. Chang
Attorney, Agent, or Firm—Blakely Sokoloff Taylor & Zafman, LLP

[57] ABSTRACT

A NAND gate including a pull-down circuit coupled to a pull-up circuit. The NAND gate is configured to drive an output signal to a high logic state at a substantially uniform slew rate regardless of the number of input signals that are in a low logic state. The pull-up circuit may include a plurality of load circuits each coupled to a corresponding one of the plurality of input signals, and a plurality of transistor circuits each comprising a plurality of transistors coupled in parallel with each other and coupled to a corresponding one of the plurality of input signals or a complement of a corresponding one of the plurality of input signals. The plurality of load circuits and the plurality of transistors may each include a p-channel MOS (PMOS) transistor. The NAND gate may be incorporated into a decoder of a synchronous or asynchronous input path circuit to generally reduce the setup and hold time window of the input path circuit.

23 Claims, 12 Drawing Sheets

SYMMETRICAL NAND GATES

CROSS-REFERENCE TO RELATED APPLICATIONS

This application may be related to copending U.S. patent application Ser. No. 08/958,464, entitled "SYMMETRICAL NOR GATES" (attorney docket no. 16820.P237) and filed on even date with the present application.

FIELD OF THE INVENTION

The present invention relates to logic circuits, and in particular to logic circuits that may be used to decode address signals in integrated circuits.

Background

Synchronous memory devices such as synchronous static random access memory (SRAM) devices are generally designed to operate as fast as possible. One component of the performance of the memory device is the time that it takes the input path circuitry to decode and latch an address for the memory device.

FIG. 1 shows a conventional address input path circuit 100. Address signals received from an address bus are supplied to input buffer 102, decoded by decoder 104, and then provided to register 106. Register 106 latches the decoded address in response to an edge transition of a clock pulse signal output from clock pulse generator 110. Clock pulse generator 110 generates the internal clock pulse in response to an external clock signal CLK provided to clock buffer 108.

Register 106 must receive a clock signal during the time in which decoder 104 is outputting the decoded address. There is typically a set-up time for circuit 100 in which the address input to input buffer 102 must be stable prior to a transition of CLK. There is also typically a hold time for circuit 100 in which the address input to input buffer 102 must be stable following a transition of CLK. The set-up and hold time window ensures that register 106 will latch the decoded address when clock pulse generator 110 provides the clock pulse signal to register 106. It is desirable to keep the set-up and hold time window small such that the address input path circuit 100 is as fast as possible. In practice, however, it is often necessary to provide a fairly long setup and hold time window to account for any timing differences or skew caused by decoder 104. For example, address input path circuit 100 must accommodate all possible address input signal logic states including all zeros, a mixture of ones and zeros, and all ones. Any timing differences between the decoding of the different address input signals is generally compensated for by providing a correspondingly longer set-up and hold time window resulting in degradation of the performance of the address input path circuit 100. Additionally, system designers generally prefer integrated circuits that have reduced or tight set-up and hold time windows.

Decoder 104 typically includes a number of NAND gates and/or NOR gates to decode an address. FIG. 2 shows a conventional two-input complementary metal oxide semiconductor (CMOS) NAND gate 200 that may be used in decoder 104. NAND gate 200 includes a pair of p-channel MOS (PMOS) transistors 202 and 204 connected in parallel with each other, and connected between a power source VDD and an output VOUT. NAND gate 200 also includes a pair of n-channel MOS (NMOS) transistors 206 and 208 connected in series with each other and coupled between VOUT and ground.

NAND gate 200 will drive VOUT to a low logic state (low) when both of inputs signals INA and INB are at a high logic state (high). NAND gate 200 will drive VOUT high when INA, INB, or INA and INB are low. The amount of time required for NAND gate 200 to drive VOUT high (low-to-high output slew rate) depends on whether INA and INB are both low, or if only one of INA or INB is low. For example, when INA transitions from a high state to a low state while INB is held high, VOUT is pulled high through only one of the PMOS transistors, namely, PMOS transistor 202. Similarly, when INB transitions from a high state to a low state while INA is held high, VOUT is pulled high by only PMOS transistor 204. On the other hand, if both INA and INB transition from high to low states, VOUT is pulled high through both of PMOS transistors 202 and 204. Two PMOS transistors generally pull VOUT to a high state faster than one PMOS transistor. For example, if PMOS transistors 202 and 204 are similarly sized to provide approximately equal amounts of current, the rising slew rate of VOUT may be approximately twice as fast when both of PMOS transistors 202 and 204 are on as opposed to when only one of PMOS transistors 202 or 204 is on. Thus, timing skew differences may exist between NAND gates in decoder 104 that receive different states of input signals, and this may increase the set-up and hold time window for address input patch circuit 100.

FIG. 3 shows another conventional two-input NAND gate 300 that includes PMOS transistor 302 coupled between VOUT and PMOS transistors 202 and 204. PMOS transistor 302 is always on because its gate is coupled to ground. PMOS transistor 302 chokes the flow of current from the power supply to VOUT to reduce the speed at which VOUT is pulled to a high state by PMOS transistor 202 and/or 204. PMOS transistor 302 is typically sized smaller than PMOS transistors 202 and 204 so that the charging of VOUT to a high state is primarily controlled by PMOS transistor 302. This generally reduces the difference between the slew rates of VOUT when pulled high by only one of PMOS transistors 202 or 204 as opposed to VOUT being pulled high by both of PMOS transistors 202 and 204. For example, the rising slew rate of VOUT may be approximately 10 to 50 percent faster when both of PMOS transistors 202 and 204 are on as opposed to when only one of PMOS transistors 202 or 204 is on. Thus, timing skew differences may still exist when decoder 104 uses NAND gates such as NAND gate 300.

FIG. 4 shows a conventional two-input NAND gate 400 that provides symmetry in the slew rate of VOUT when VOUT is switching from a high state to a low state. NAND gate 400 includes another pair of NMOS transistors 402 and 404 coupled in series with each other, and coupled in parallel with the NMOS transistors 206 and 208 between VOUT and ground. NMOS transistor 402 has its gate coupled to input signal INB, and NMOS transistor 404 has its gate coupled to input signal INA. NAND gate 400 will generally cause VOUT to be driven low at the same slew rate regardless of whether input signal INA or INB is driven high first. For example, if INA is driven high before INB in NAND gate 200 of FIG. 2, then node 207 will be driven to one threshold drop below the voltage level of input signal INA. When INB is driven high some internal time later, NMOS transistor 208 must then discharge node 207, and then discharge VOUT to ground. If, however, INB is driven high before INA is driven high, then NMOS transistor 208 pulls node 207 to ground, and then NMOS transistor 206 pulls VOUT to ground. Thus, it is preferable that INA and INB are simultaneously driven to a high state, or that INB is driven high before INA. The addition of NMOS transistors 402 and 404 ensure that one of the NMOS transistor 208 or 404 will turn on first before a corresponding one of NMOS transistors 206 and 402 turn on when INA and INB are high.

FIG. 5 shows a conventional CMOS NOR gate 500 that may be used in decoder 104. NOR gate 500 includes a pair of PMOS transistors 502 and 504 coupled in series with each other and coupled between VDD and VOUT. NOR gate 500 also includes a pair of NMOS transistors 506 and 508 coupled in parallel with each other and coupled between VOUT and ground.

NOR gate 500 will drive VOUT to a high logic state when both of inputs signals INA and INB are at a low logic state. NOR gate 500 will drive VOUT low when INA, INB, or INA and INB are high. The amount of time required for NOR gate 500 to drive VOUT low (high-to-low output slew rate) depends on whether INA and INB are both high, or if only one of INA or INB is high. For example, when INA transitions from a low state to a high state while INB is held low, VOUT is pulled low through only one of the NMOS transistors, namely, NMOS transistor 506. Similarly, when INB transitions from a low state to a high state while INA is held low, VOUT is pulled low through only NMOS transistor 508. On the other hand, if both INA and INB transition from low to high states, VOUT is pulled low through both of NMOS transistors 506 and 508. Two NMOS transistors generally pull VOUT to a low state faster than one NMOS transistor. Thus, timing skew differences may exist between NOR gates in decoder 104 that receive different states of input signals, and this may increase the set-up and hold time window for address input patch circuit 100.

FIG. 6 shows another conventional two-input NOR gate 600 that includes NMOS transistor 602 coupled between VOUT and NMOS transistors 506 and 508. NMOS transistor 602 has its gate coupled to VDD and is always on. As with PMOS transistor 302 of FIG. 3, NMOS transistor 602 chokes the flow of current from VOUT to ground to reduce the speed at which VOUT is pulled to a low state by NMOS transistors 506 and 508. This generally reduces the difference between the slew rates of VOUT when pulled low by only one of NMOS transistors 506 or 508 as opposed to VOUT being pulled low by both of NMOS transistors 506 and 508.

FIG. 7 shows a conventional two-input NOR gate 700 that provides symmetry in the slew rate of VOUT when VOUT is switching from a low state to a high state. NOR gate 700 includes another pair of PMOS transistors 702 and 704 coupled in series with each other, and coupled in parallel with PMOS transistors 502 and 504 between VDD and VOUT. PMOS transistor 702 has its gate coupled to input signal INB, and PMOS transistor 704 has its gate coupled to input signal INA. As with NMOS transistors 402 and 404 of FIG. 4, PMOS transistors 702 and 704 will generally cause VOUT to be driven high at the same slew rate regardless of whether input signal INA or INB is driven low first.

Therefore, it is desirable to reduce the set-up and hold time window of an address input path circuit of a synchronous or asynchronous device by reducing the difference in the output slew rates of the logic gates that are used in a decoder circuit of the address input path.

SUMMARY OF THE INVENTION

The present invention concerns a NAND gate including a pull-down circuit coupled to a pull-up circuit. The NAND gate is configured to drive an output signal to a high logic state at a substantially uniform slew rate regardless of the number of input signals that are in a low logic state. The pull-up circuit may include a plurality of load circuits each coupled to a corresponding one of the plurality of input signals, and a plurality of transistor circuits each comprising a plurality of transistors coupled in parallel with each other and coupled to a corresponding one of the plurality of input signals or a complement of a corresponding one of the plurality of input signals. The plurality of load circuits and the plurality of transistors may each include a p-channel MOS (PMOS) transistor. The NAND gate may be incorporated into a decoder of a synchronous or asynchronous input path circuit to generally reduce the set-up and hold time widow of the input path circuit.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Symmetrical logic gates are disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1:
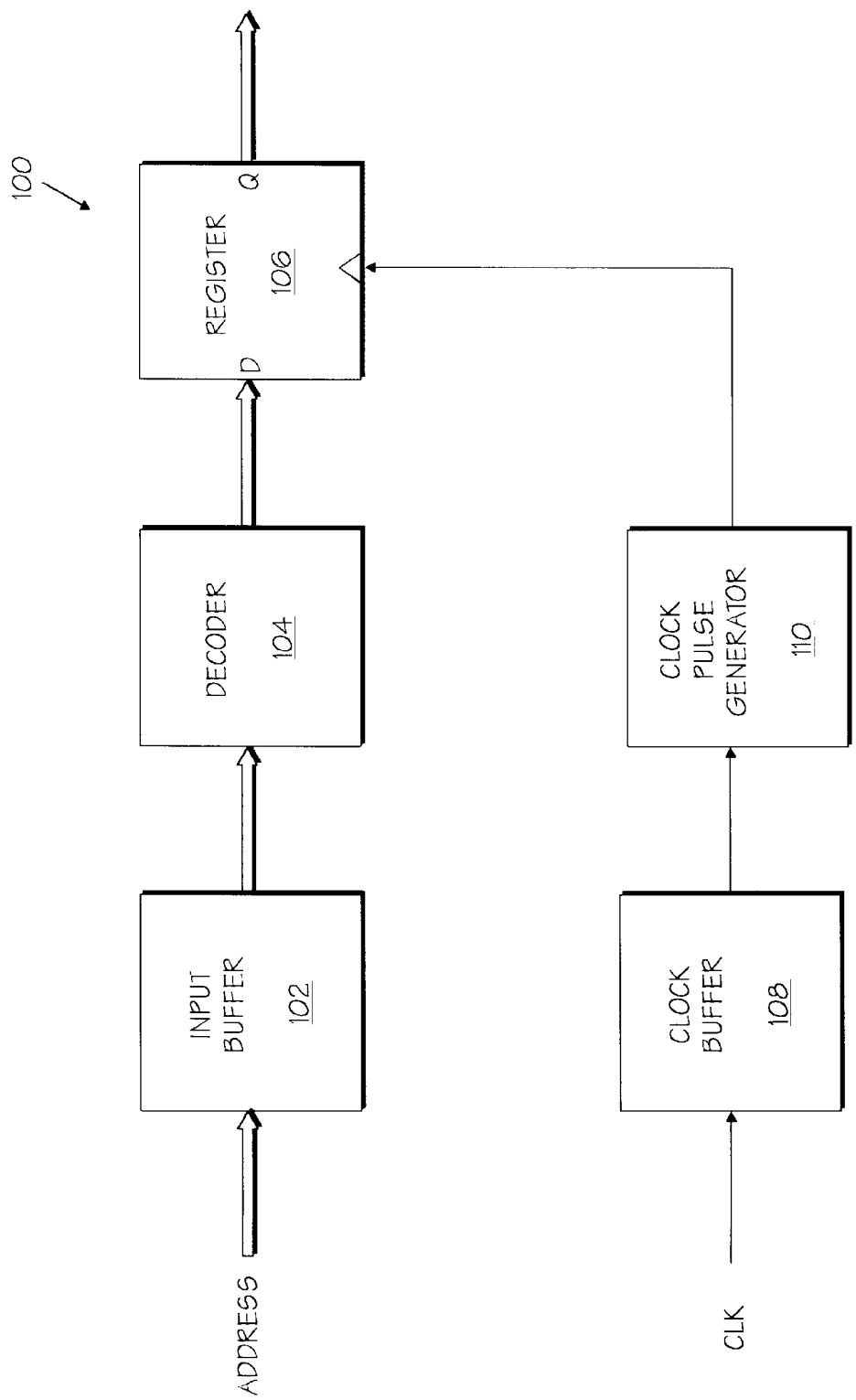
FIG. 1 is a block diagram of a conventional input path circuit.
Figure 2:
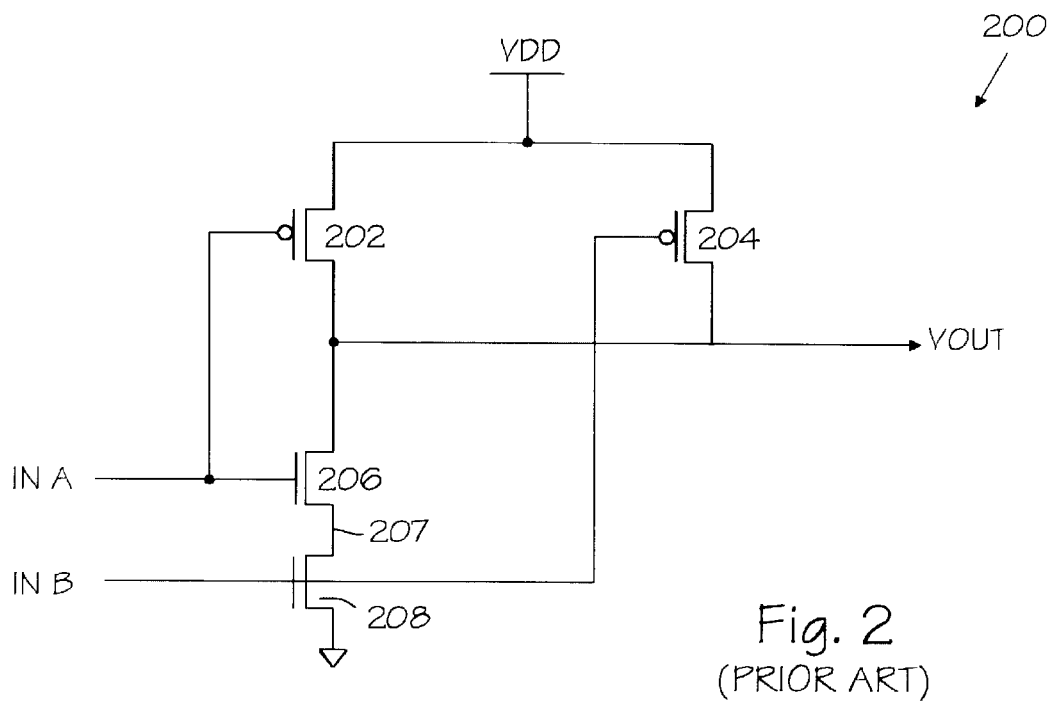
FIG. 2 is a circuit diagram of a first conventional two-input NAND gate.
Figure 3:
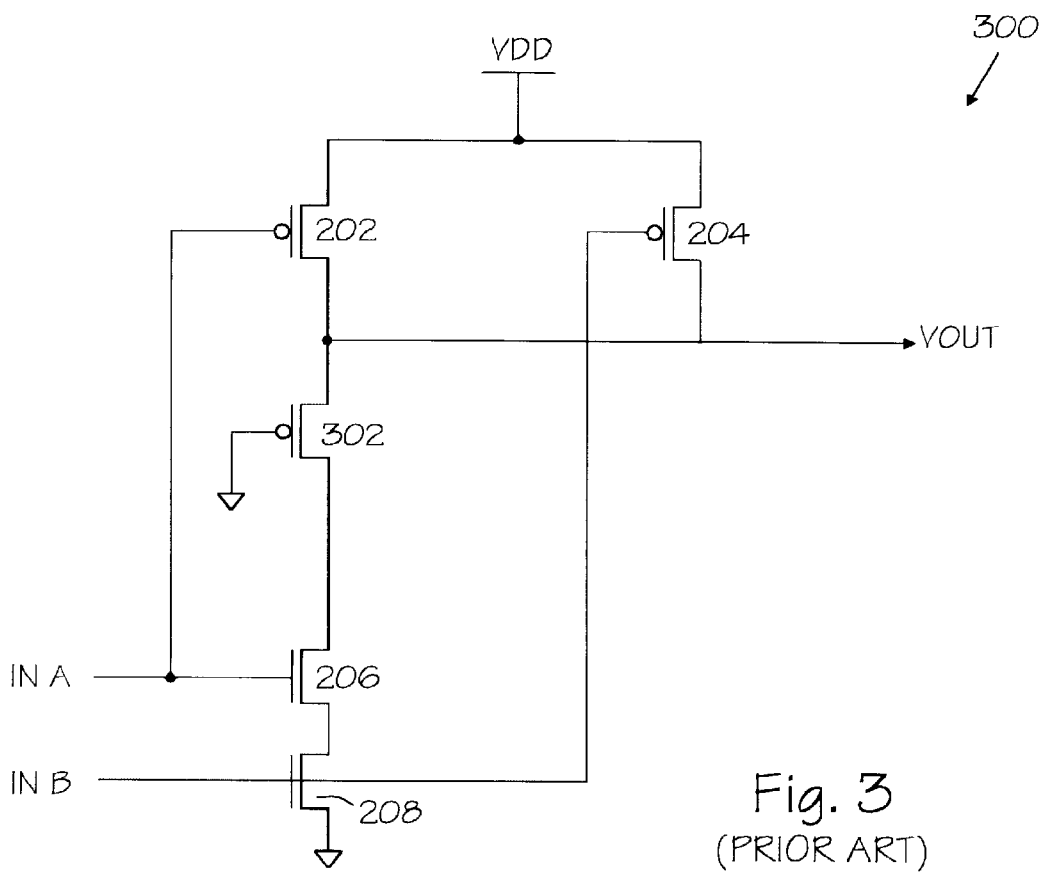
FIG. 3 is a circuit diagram of second conventional two-input NAND gate.
Figure 4:
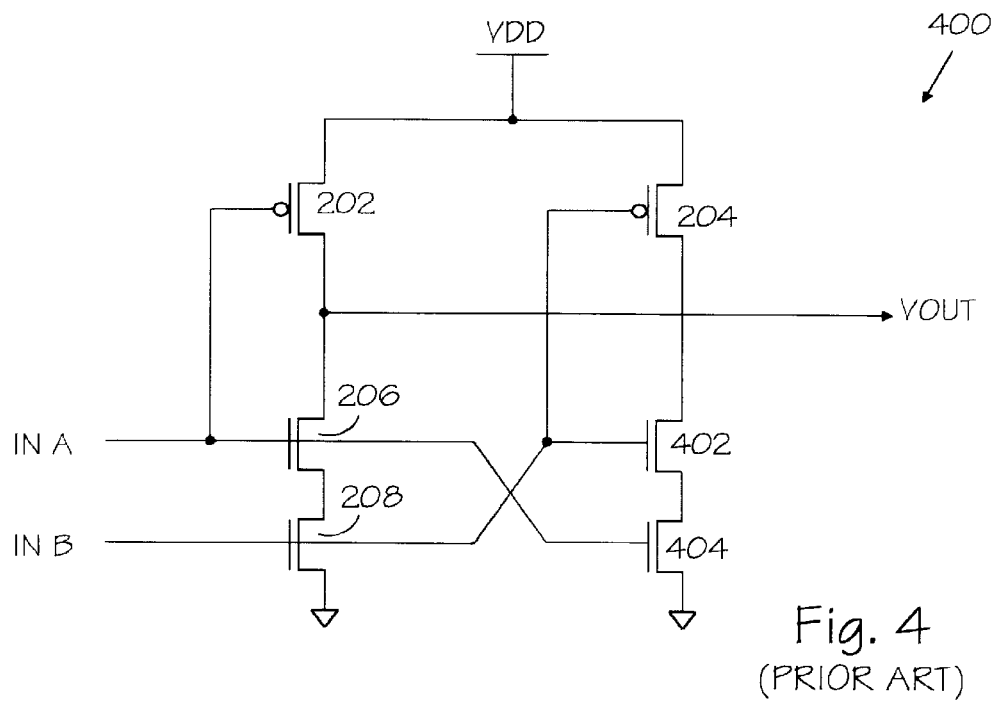
FIG. 4 is a circuit diagram of third conventional two-input NAND gate.
Figure 5:
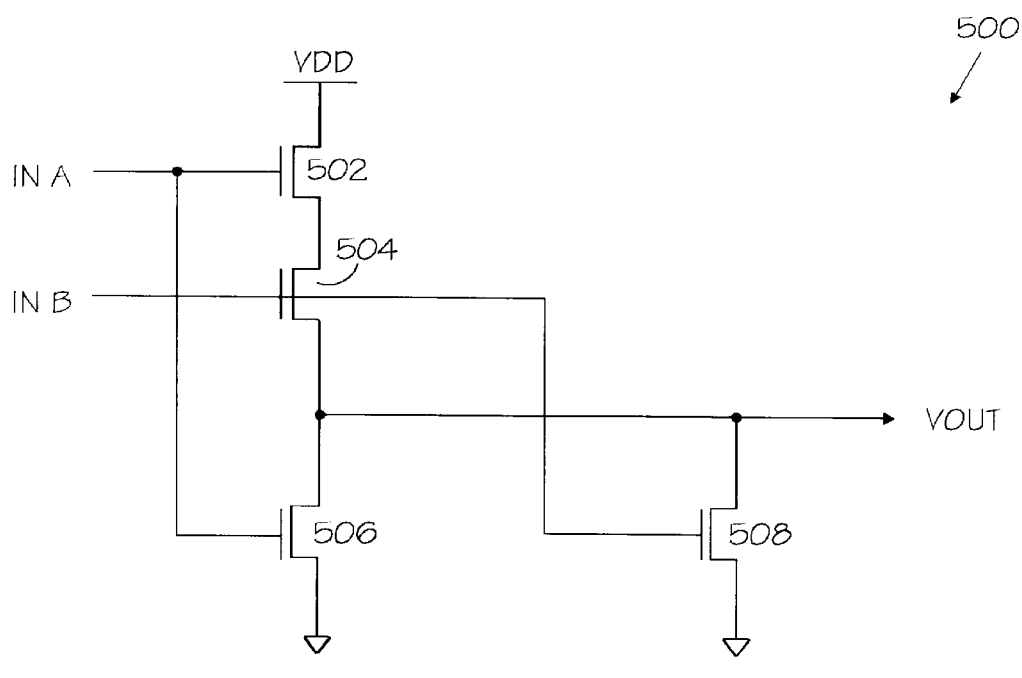
FIG. 5 is a circuit diagram of a first conventional two-input NOR gate.
Figure 6:
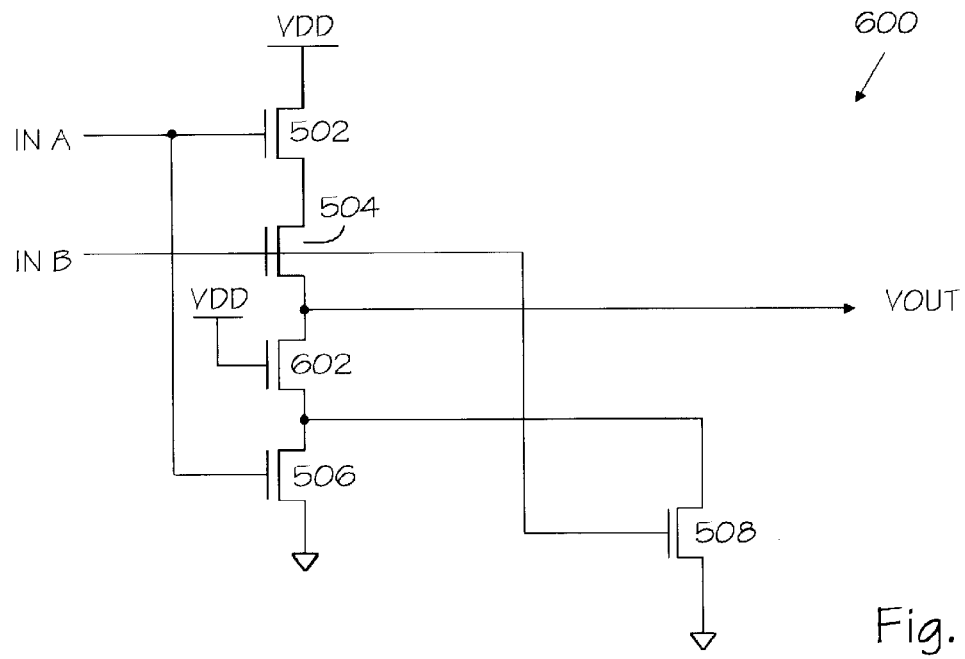
FIG. 6 is a circuit diagram of a second conventional two-input NOR gate.
Figure 7:
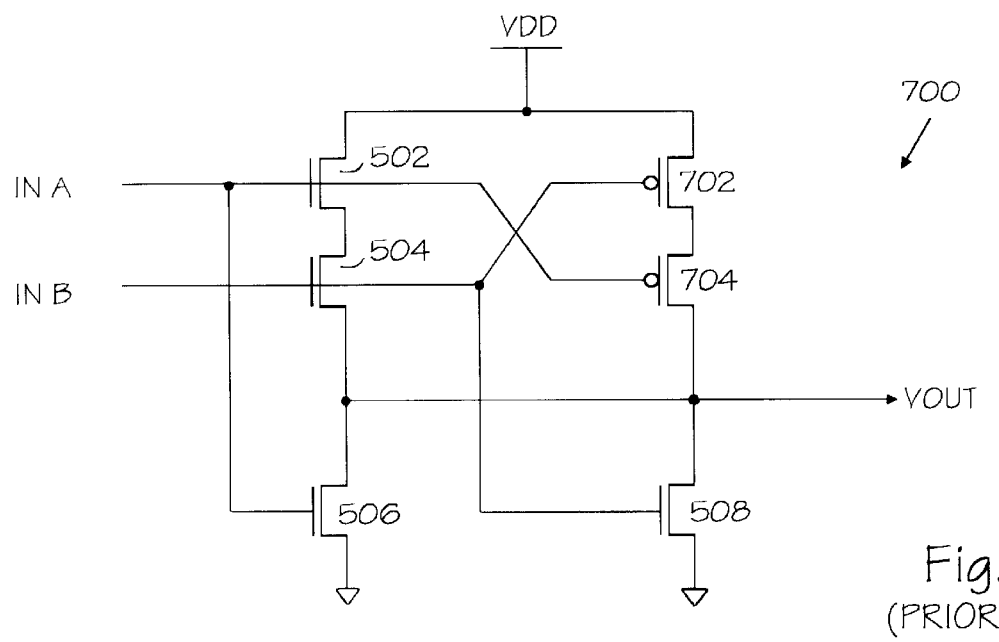
FIG. 7 is a circuit diagram of a third conventional two-input NOR gate.
Figure 8:
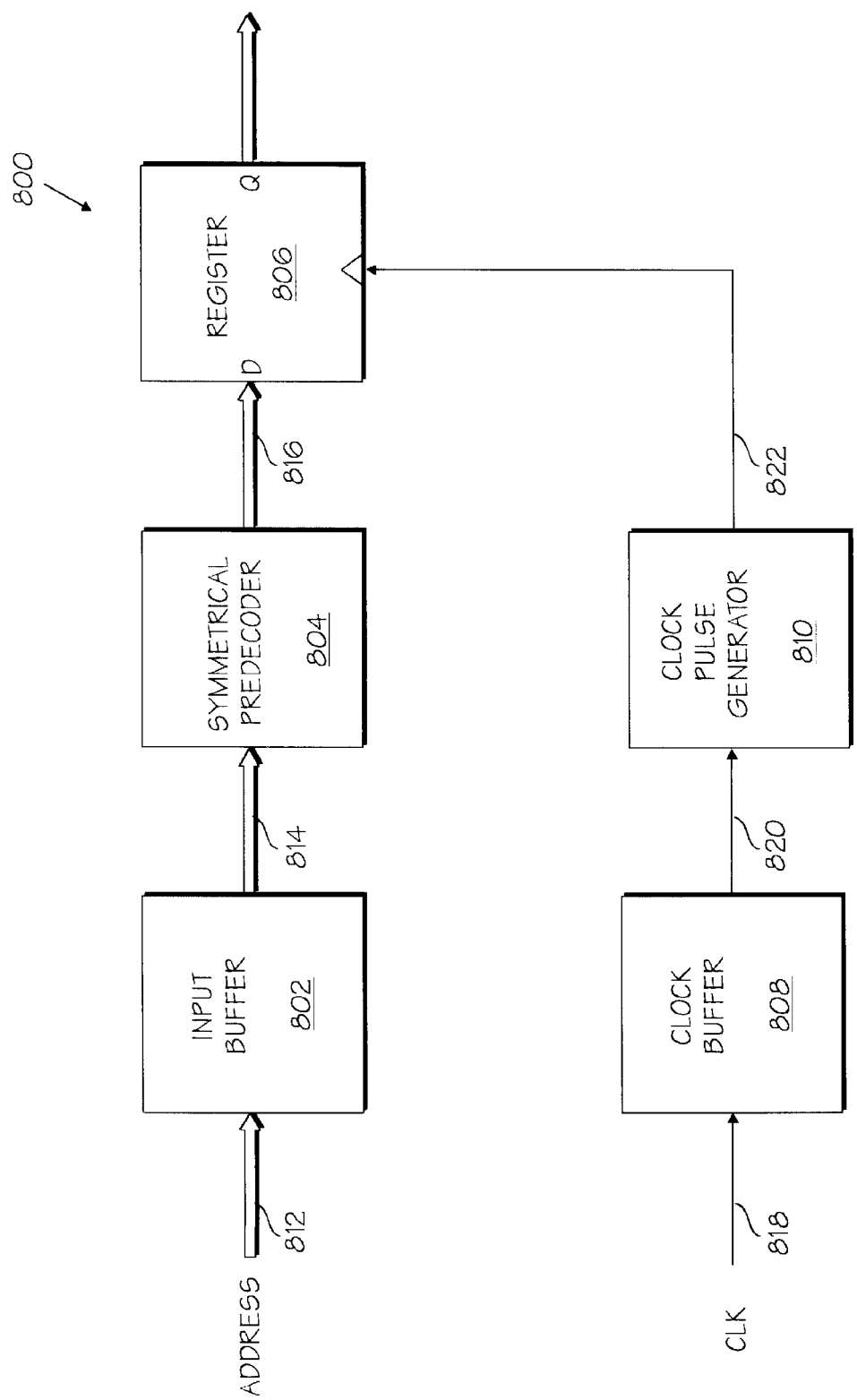
FIG. 8 is a block diagram of one embodiment of an input path circuit according to the present invention.

FIG. 8 shows an exemplary address input path circuit or system 800 according to the present invention. Address input path circuit 800 may be included within a synchronous memory device such as a synchronous static random access memory (SRAM) device, a synchronous cache-RAM device, or any other synchronous device. Address input path circuit 800 includes an address path having input buffer 802 and symmetrical predecoder 804. Input path circuit 800 also includes a clock path having clock buffer 808 and clock pulse generator 810.

The address path receives an address (ADDRESS) from address bus 812, and may buffer the address using input buffer 802. Input buffer 802 may include one or more buffers that receive one or more address signals from bus 812. For one embodiment, input buffer 802 may be a transistor—transistor logic (TTL) buffer that translates the address signals on bus 812 to CMOS or other voltage ranges on bus 814. For an alternative embodiment, input buffer 802 may be omitted and the address signals may be directly coupled to bus 814.

The buffered signals on bus 814 may be provided to symmetrical predecoder 804 that may generate a decoded address on bus 816. The decoded address signals may each have symmetrical low-to-high or high-to-low slew rates regardless of the logic states of the buffered address signals. This may advantageously reduce the set-up and hold time window, and may increase performance of the synchronous device that incorporates address input path circuit 800.

Additionally, and/or alternatively, the low-to-high and high-to-low slew rates of each of the decoded address signal may be substantially the same such that symmetrical predecoder 804 outputs the decoded address to bus 816 in a substantially uniform amount of time regardless of the logic states of the buffered address signals on bus 814.

For an alternative embodiment, one or more additional decode circuits may be included in the address path to further decode the address signals. For example, a mid-decoder may be coupled between symmetrical predecoder 804 and register 806 to perform a second level of decoding.

The decoded address provided on bus 816 may be clocked into register 806 by the transition of a clock pulse provided on line 822. The output of register 806 may be coupled to a row decoder to select rows of a memory array, a column decoder to select columns of a memory array, and/or other circuits in an integrated circuit or system. Register 806 may be D-type register or latch, a multi-stage register (e.g., a master-slave register), or any other clocked storage element.

The clock pulse signal on line 822 is generated by the clock path of address input path circuit 800. Clock buffer 808 receives a clock signal CLK on line 818 and generates a buffered clock signal on line 820. The clock signal on line 818 may be any clock signal of any frequency or having any phase relationship. Clock pulse generator 810 may generate a clock pulse signal on line 822 in response to a buffered clock signal on line 820. Clock pulse generator 810 may be any type of clock pulse generator that generates a clock pulse in response to a transition of the buffered clock signal on line 820. A transition of the clock pulse on line 822 may be used by register 806 to store or latch the decoded address on bus 816. For an alternative embodiment, the clock signal CLK may be coupled directly to clock pulse generator 810, or may be coupled directly to the clock input of register 806.

Address input path 800 may also be an asynchronous circuit that may be included within an asynchronous device such as an asynchronous SRAM, cache-RAM, or any other asynchronous device. In an asynchronous configuration, register 806 may latch a decoded address from symmetrical predecoder 804 in response to a control signal rather than the clock signal generated by the address path of circuit 800. For one embodiment, the control signal may be a write enable signal that when asserted to an active state causes register 806 to latch the decoded address signals. The set-up and hold time window for circuit 800 may be measured relative to a transition of the control signal. The control signal may be supplied from within a device that incorporates circuit 800, or the control signal may be supplied from an external source.

As previously described, conventional address input path circuits may need fairly long set-up and hold time windows to accommodate differences in decoder timing delays as a result of different logic states on the address input signals. Symmetrical predecoder 804 may decrease the set-up and hold time window relative to conventional address input path circuits because symmetrical predecoder 804 may generate decoded address signals having substantially symmetrical low-to-high or high-to-low slew rates regardless of logic states of the buffered address signals provided to the input of symmetrical predecoder 804. For one embodiment, the set-up and hold window may be reduced from approximately 2.5 to 5 nanoseconds to approximately 1 to 2 nanoseconds.

Figure 9:
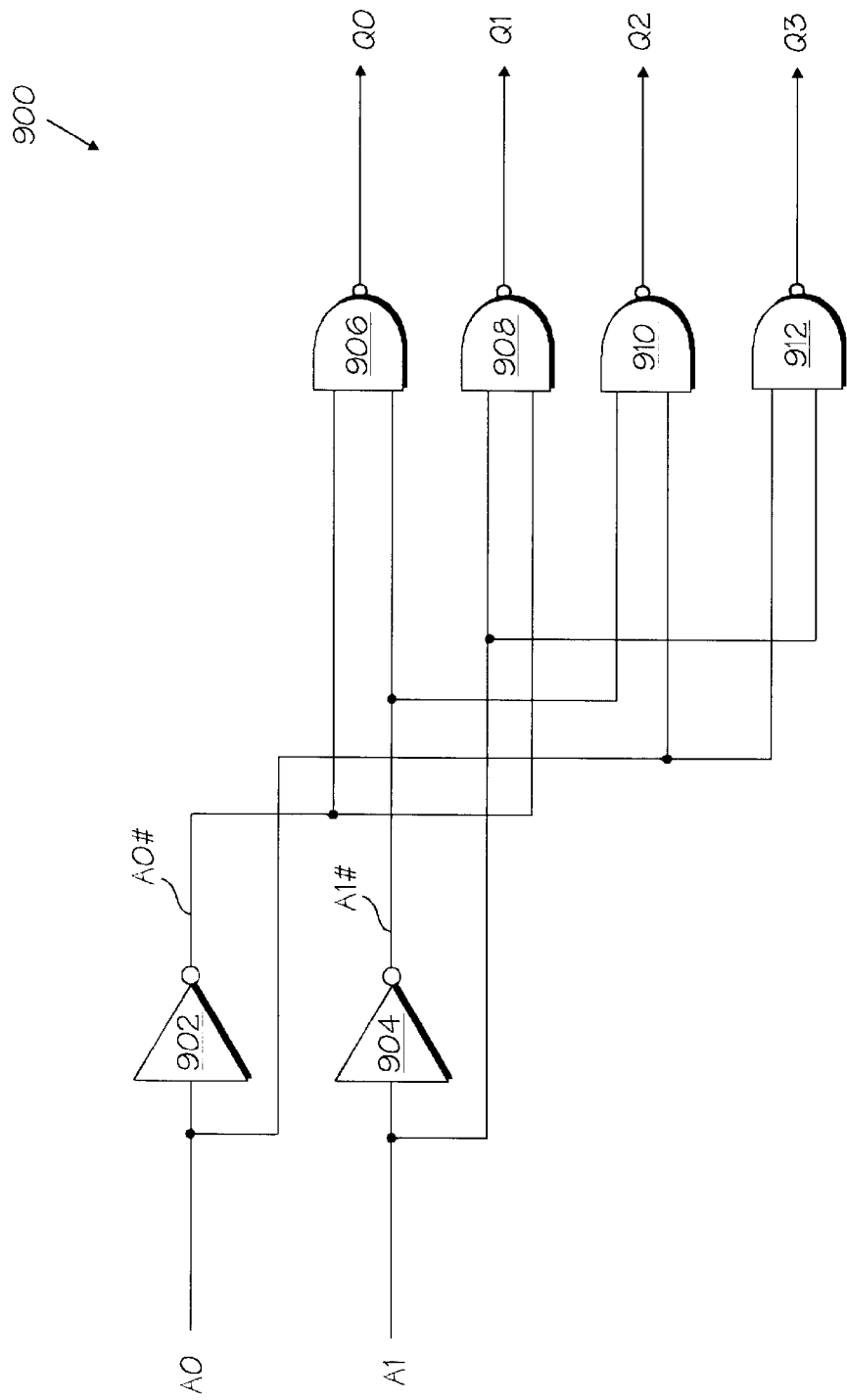
FIG. 9 is a block diagram of one embodiment of the input path circuit of FIG. 8 including one embodiment of a decoder having NAND gates.

One exemplary embodiment of symmetrical predecoder 804 is shown as symmetrical predecoder 900 of FIG. 9. Symmetrical predecoder 900 is a single-stage decoder that decodes two address signals A0 and A1 into four output signals Q0–Q3 as summarized in Table 1 below. Symmetrical predecoder 900 includes inverters 902 and 904 that generate A0# and A1#, respectively. The pound symbol "#" following a signal name will be used throughout this application to denote an active low signal. Symmetrical predecoder 900 also includes four two-input NAND gates 906, 908, 910, and 912. NAND gate 906 generates Q0 in response to A0# and A1#; NAND gate 908 generates A1 in response to A0# and A1, NAND gate 910 generates Q2 in response to A0 and A1#; and, NAND gate 912 generates Q3 in response to A0 and A1.

TABLE 1

| A1 | A0 | Q3 | Q2 | Q1 | Q0 |
|----|----|----|----|----|-----|
| 0 | 0 | 1 | 1 | 1 | 0 |
| 0 | 1 | 1 | 1 | 0 | 1 |
| 1 | 0 | 1 | 0 | 1 | 1 |
| 1 | 1 | 0 | 1 | 1 | 1 |

Additional inverters and NAND gates may be added to symmetrical predecoder 904 to decode any number of address input signals as generally known in the art. For one embodiment, multi-stage or tree decoding may also be used to decode larger numbers of address signals.

NAND gates 906, 908, 910, and 912 may be symmetrical NAND gates that generate decoded signals Q0–Q3 having low-to-high slew rates that may be substantially the same regardless of whether one or more of A0 and A1 (or their complements) are low. Additionally, and/or alternatively, NAND gates 906, 908, 910, and 912 may be symmetrical NAND gates that generate decoded signals Q0–Q3 having high-to-low slew rates that may be substantially the same regardless of whether one or more of A0 or A1 (or their complements) is driven to a high logic state before the other. The output slew rates of the decoded signal Q0–Q3 may have substantially the same low-to-high slew rate as the high-to-low slew rate, or they may be different.

Figure 10:
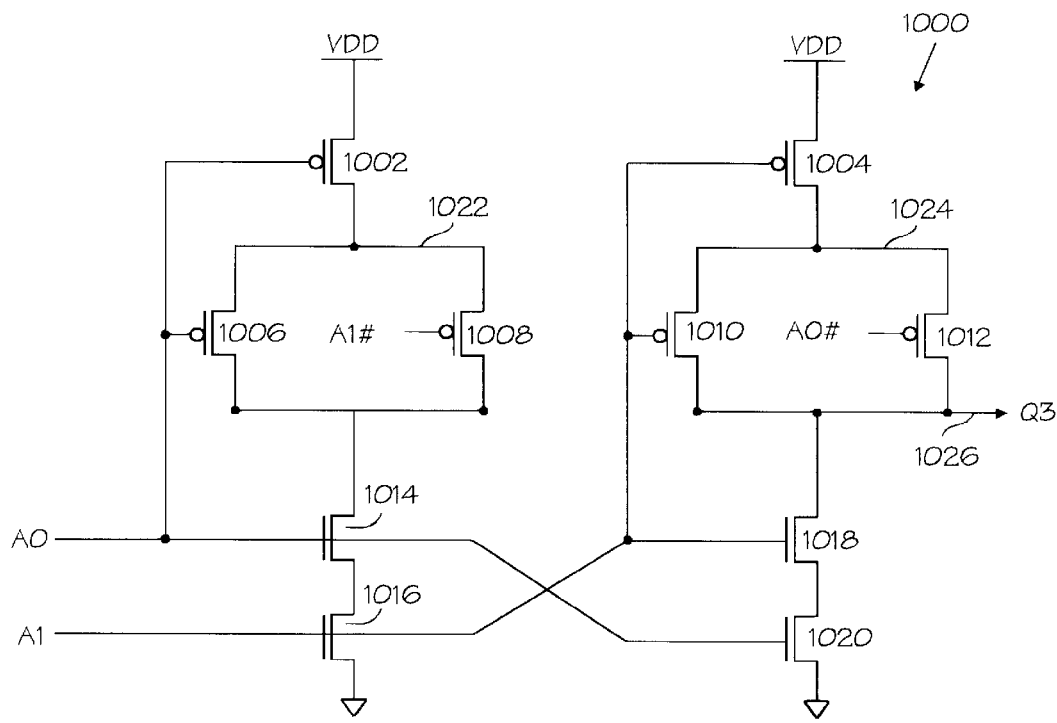
FIG. 10 is a circuit diagram of one embodiment of a two-input NAND gate according to the present invention.

FIG. 10 shows NAND gate 1000 that is one exemplary embodiment of NAND gate 912 of FIG. 9. NAND gate 1000 may also be used for NAND gates 906, 908, and 910 so as to output substantially uniform decoded signals Q0–Q3. NAND gate 1000 may also be used for any configuration of decoder 804 of FIG. 8 that uses NAND gates. NAND gate 1000 may include a pull-down circuit and a pull-up circuit.

The pull-down circuit may include a first pull-down block and a second pull-down block. The first pull-down block may include n-channel MOS (NMOS) transistors 1014 and 1016 coupled in series with each other, and coupled between output line 1026 and ground. NMOS transistor 1014 has its drain coupled to output line 1026, its gate coupled to A0, and its source coupled to the drain of NMOS transistor 1016. NMOS transistor 1016 has its gate coupled to A1, and its source coupled to ground. The second pull-down block may include NMOS transistors 1018 and 1020 coupled in series with each other, and coupled between output line 1026 and ground. NMOS transistor 1018 has its drain coupled to output line 1026, its gate coupled to A1, and its source coupled to the drain of NMOS transistor 1020. NMOS transistor 1020 has its gate coupled to A0, and its source coupled to ground. When A1 and A0 are both high logic states (i.e., 11), the PMOS transistors are off and the NMOS transistors are on pulling Q3 low.

By sizing NMOS transistor 1014 to have approximately the same size (e.g., transistors channel lengths, widths, etc.) as NMOS transistor 1018, and by sizing NMOS transistor 1016 to have approximately the same size as NMOS transistor 1020, the pull-down circuit may provide a substantially uniform or symmetrical high-to-low output slew rate regardless of the order in which A0 or A1 transition from a low state to a high state.

Figure 13:
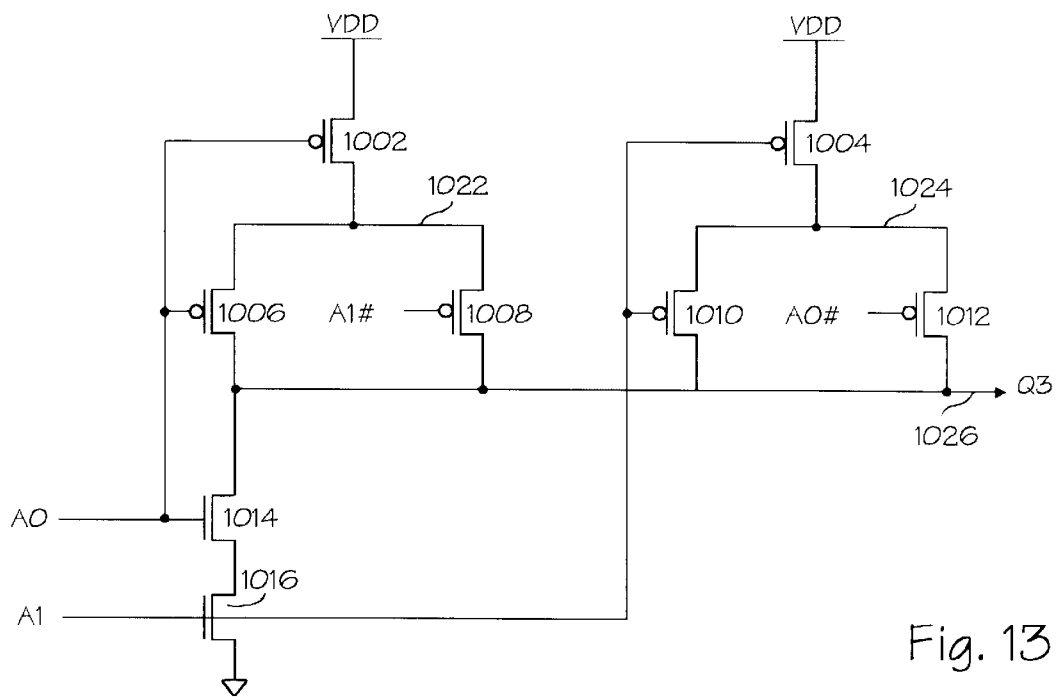
FIG. 13 is a circuit diagram of another embodiment of a two-input NAND gate according to the present invention.

For an alternative embodiment, either pull-down block of NMOS transistors may be removed. FIG. 13 illustrates a NAND gate with only the first pull-down block coupled between output line 1026 and ground.

The pull-up circuit may include a first pull-up block and a second pull-up block. The first pull-up block may include p-channel MOS (PMOS) PMOS transistors 1002, 1006, and 1008. PMOS transistor 1002 is a load transistor that has its source coupled to a power supply voltage VDD, its gate coupled to input signal A0, and its drain coupled to node 1022. The power supply voltage may be any voltage required to operate NAND gate 1000 (e.g., from approximately 2.7 volts to approximately 6.0 volts). VDD may be coupled to PMOS transistors 1002 and 1004 via a conduit (e.g., diffusion regions, metal lines, etc.) as generally known in the art. PMOS transistors 1006 and 1008 are coupled in parallel with each other and are coupled between node 1022 and output line 1026. PMOS transistor 1006 has its source coupled to node 1022, its gate coupled to A0, and its drain coupled to output line 1026. PMOS transistor 1008 has its source coupled to node 1022, its gated coupled to A1#, and its drain coupled to output line 1026. The second block may include PMOS transistors 1004, 1010, and 1012. PMOS transistor 1004 is a load transistor that has its source coupled to a power supply voltage VDD, its gate coupled to input signal A1, and its drain coupled to node 1024. PMOS transistors 1010 and 1012 are coupled in parallel with each other and are coupled between node 1024 and output line 1026. PMOS transistor 1010 has its source coupled to node 1024, its gate coupled to A1, and its drain coupled to output line 1026. PMOS transistor 1012 has its source coupled to node 1024, its gated coupled to A0#, and its drain coupled to output line 1026.

The pull-up circuit may pull up Q3 from a low logic state to a high logic state at a substantially uniform slew rate when A1 and A0 transition from 11 to 10, 01, or 00, respectively. The operation of NAND gate 1000 may be evident by examining each case in turn. In the first case: A1 and A0 transition from 11 to 01, respectively; NMOS transistors 1016 and 1018 are turned off decoupling output line 1026 from ground; and, PMOS transistors 1004, 1010, and 1012 are turned on to pull up Q3 at a first slew rate towards VDD.

In the second case: A1 and A0 transition from 11 to 10, respectively; NMOS transistors 1014 and 1020 are turned off decoupling output line 1026 from ground; and, PMOS transistors 1002, 1006, and 1008 are turned on to pull up Q3 at a second slew rate towards VDD. The first and second slew rates may be substantially the same or uniform if, for example, PMOS transistors 1002 and 1004 are sized approximately the same (i.e., approximately the same channel lengths and widths, etc.), PMOS transistors 1006 and 1010 are sized approximately the same, and PMOS transistors 1008 and 1012 are sized approximately the same.

In the third case: A1 and A0 transition from 11 to 00, respectively; NMOS transistors 1014, 1016, 1018, and 1020 are turned off decoupling output line 1026 from ground; and, PMOS transistors 1002, 1006, 1004, and 1010 are turned on to pull up Q3 at a third slew rate towards VDD. The operation of NAND gate 1000 is summarized in Table 2.

TABLE 2

| A1 | A0 | Q3 | 1002 | 1004 | 1006 | 1008 | 1010 | 1012 | 1014 | 1016 | 1018 | 1020 |
|---|---|---|---|---|---|---|---|---|---|---|---|---|
| 0 | 0 | 1 | On  | On  | On  | Off | On  | Off | Off | Off | Off | Off |
| 0 | 1 | 1 | Off | On  | Off | Off | On  | On  | On  | Off | Off | On  |
| 1 | 0 | 1 | On  | Off | On  | On  | Off | Off | Off | On  | On  | Off |
| 1 | 1 | 0 | Off | Off | Off | On  | Off | On  | On  | On  | On  | On  |

Figure 11:
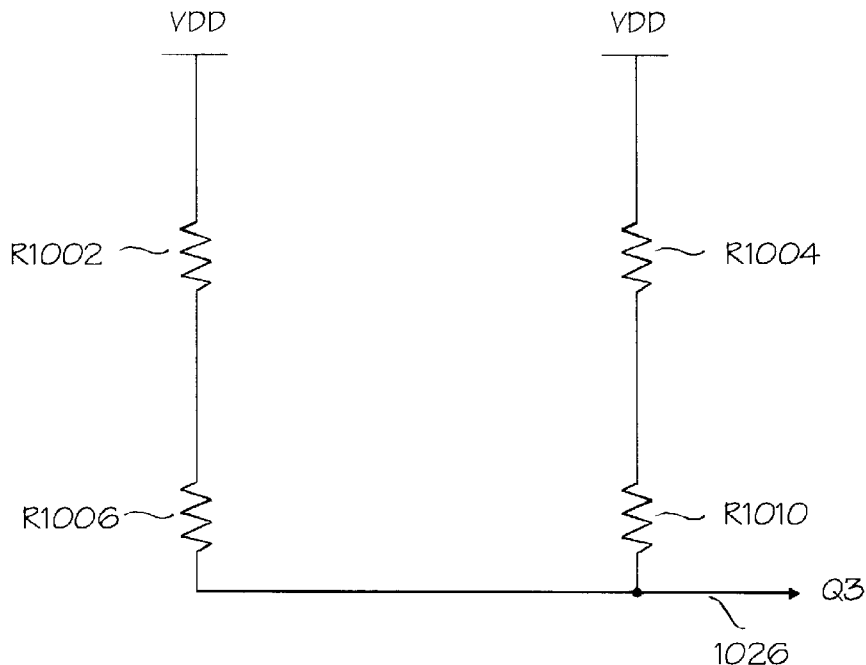
FIG. 11 is one embodiment of an equivalent resistance circuit for one mode of operation of the NAND gate of FIG. 10.

The third slew rate may be substantially equivalent to the first and second slew rates by, for example, appropriately sizing the PMOS transistors of the pull-up circuit. The sizes of PMOS transistors 1002, 1004, 1006, 1008, 1010, and 1012 may be chosen to yield the same equivalent static resistance for the pull up circuit in each of the three cases. For one embodiment, when A1 and A0 are both low, the equivalent static circuit may be as illustrated in FIG. 11. The equivalent circuit of FIG. 11 includes resistors $R_{1002}$, $R_{1006}$, $R_{1004}$, and $R_{1010}$ that may correspond to the static on resistance of PMOS transistors 1002, 1006, 1004, and 1010, respectively. If the resistance of $R_{1002}$ is equivalent to that of $R_{1004}$, and if the resistance of $R_{1006}$ is equivalent to that of $R_{1010}$, then the equivalent resistance from output line 1026 to VDD of FIG. 11 may be as indicated in Equation 1.

$$R_{eq} = \frac{R_{1002} + R_{1006}}{2} \qquad \text{(Equation 1)}$$

Figure 12:
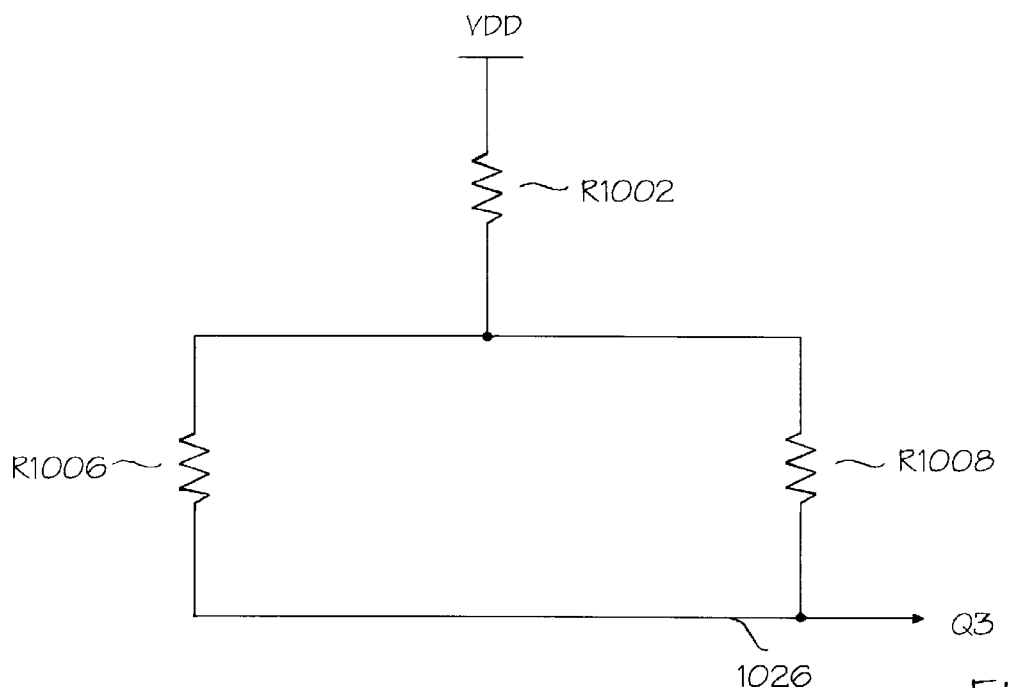
FIG. 12 is one embodiment of an equivalent resistance circuit for another mode of operation of the NAND gate of FIG. 10.

When A1 and A0 are high and low, respectively, then the equivalent static circuit may be as illustrated in FIG. 12. The equivalent circuit of FIG. 12 includes resistors $R_{1002}$, $R_{1006}$, and $R_{1008}$ that may correspond to the static resistance of PMOS transistors 1002, 1006, and 1008, respectively. The equivalent resistance from output line 1026 to VDD of FIG. 12 may be as indicated in Equation 2.

$$R_{eq} = R_{1002} + \frac{R_{1006} \times R_{1008}}{R_{1006} + R_{1008}} \qquad \text{(Equation 2)}$$

When A1 and A0 are low and high, respectively, then the equivalent static circuit may be similar to that as illustrated in FIG. 12, wherein resistors $R_{1002}$, $R_{1006}$, and $R_{1008}$ are replaced with resistors $R_{1004}$, $R_{1010}$, and $R_{1012}$, respectively. Resistors $R_{1004}$, $R_{1010}$, and $R_{1012}$ may correspond to the static resistance of PMOS transistors 1004, 1010, and 1012, respectively. Equations 1 and 2 may be set equal to each other to produce Equation 3.

$$\frac{R_{1002} - R_{1006}}{2} + \frac{R_{1006} \times R_{1008}}{R_{1006} + R_{1008}} = 0 \qquad \text{(Equation 3)}$$

Equation 3 may then be used to solve for the static resistance of each of resistors $R_{1002}$, $R_{1006}$, and $R_{1008}$. If each pair of PMOS transistors 1002 and 1004, 1006 and 1010, and 1008 and 1012 are sized approximately equally, the resistance of resistors $R_{1004}$, $R_{1010}$, and $R_{1012}$ may be equal to the resistance of resistors $R_{1002}$, $R_{1006}$, and $R_{1008}$, respectively.

$R_{1002}$, $R_{1006}$, and $R_{1008}$ may be any values that approximately satisfy Equation 3. For one embodiment, the ratio of $R_{1002}$:$R_{1006}$:$R_{1008}$ (and $R_{1004}$:$R_{1010}$:$R_{1012}$) may be approximately (⅓):1:(½). For another embodiment, the ratio of $R_{1002}$:$R_{1006}$:$R_{1008}$ (and $R_{1004}$:$R_{1010}$:$R_{1012}$) may be approximately 1:2.5:1. The sizes of PMOS transistors 1002, 1004, 1006, 1008, 1010, and 1012 may then determined given that the static resistance of a PMOS transistor in the saturation or linear state is approximately proportional to the channel length of a PMOS transistor divided by its channel width. As generally known in the art, a PMOS transistor may transition from a saturation region to a linear region, and from a linear region to a cut-off region. For one embodiment, the ratio of channel width to channel length for PMOS transistors 1002:1006:1008 (and 1004:1010:1012) may be approximately 3:1:2. For another embodiment, the ratio of channel width to channel length for PMOS transistors 1002:1006:1008 (and 1004:1010:1012) may be approximately 2.5:1:2.5.

Thus, by appropriately sizing the PMOS transistors of the pull-circuit of NAND gate 1000, the output signal Q3 on output line 1026 may have a substantially uniform or symmetrical low-to-high slew rate regardless of whether inputs signals A1 and A0 transition from 11 to 01, 10, or 00. The slew rate of Q3 may be set to any value by the sizes of the PMOS transistors of the pull-up circuit. For one embodiment, the slew rate of Q3 transitioning from approximately zero volts to approximately 3.3 volts is approximately 100 picoseconds to approximately 250 picoseconds, and preferably from approximately 150 picoseconds to approximately 200 picoseconds.

Thus, NAND gate 1000 may be a symmetrical NAND gate that has a substantially uniform low-to-high output slew rate regardless of the number of inputs signals that transition from a high logic state to a low logic state. Additionally, NAND gate 1000 may be a symmetrical NAND gate that has a substantially uniform high-to-low output slew rate regardless of when the inputs signals transition from a low logic state to a low logic state. The PMOS and NMOS transistors of NAND gate 1000 may also be sized relative to each other such that the low-to-high and high-to-low slew rates of Q3 are substantially equal.

The concept of NAND gate 1000 may be used in X-input CMOS NAND gates, where X>1. For each input signal that is added to the X-input NAND gate, an additional pull-up block is added having a load transistor coupled in series with a transistor circuit between a power supply and an output node of the NAND gate. The transistor circuit includes a group of parallel coupled transistors wherein one of the transistors is controlled by the additional input signal, and the other transistors are controlled by the complements of the remaining input signals. An additional pull-down block may also be added. The additional pull-down block may have an additional transistor coupled in series with transistors corresponding to each of the other input signals.

An exemplary embodiment of a three-input NAND gate 1400 is illustrated in FIG. 12. NAND gate 1400 may generate an output signal QOUT having a substantially uniform low-to-high slew rate, and a substantially uniform high-to-low slew rate.

The pull-up circuit of NAND gate 1400 may include PMOS transistors 1402–1413. PMOS transistors 1402, 1403, and 1404 are load transistors each having its source coupled to VDD, its gate coupled to A0, A1, and A2, respectively, and its drain coupled to nodes 1423, 1424, and 1425, respectively. PMOS transistors 1405–1407 are coupled in parallel with each other and are coupled between node 1423 and output line 1426 that provides output signal QOUT. The gates of PMOS transistors 1405, 1406, and 1407 are coupled to A0, A1#, and A2#, respectively. PMOS transistors 1408–1410 are coupled in parallel with each other and are coupled between node 1424 and output line 1426. The gates of PMOS transistors 1408, 1409, and 1410 are coupled to A1, A0#, and A2#, respectively. PMOS transistors 1411–1413 are coupled in parallel with each other and are coupled between node 1425 and output line 1426. The gates of PMOS transistors 1411, 1412, and 1413 are coupled to A2, A0#, and A1#, respectively.

The pull-down circuit of NAND gate 1400 may include NMOS transistors 1414–1422. NMOS transistors 1414–1416 are coupled in series with each other and are coupled between output line 1426 and ground. The gates of NMOS transistors 1414, 1415, and 1416 are coupled to A0, A1, and A2, respectively. NMOS transistors 1417–1419 are coupled in series with each other and are coupled between output line 1426 and ground. The gates of NMOS transistors 1417, 1418, and 1419 are coupled to A1, A2, and A0, respectively. NMOS transistors 1420–1422 are coupled in series with each other and are coupled between output line 1426 and ground. The gates of NMOS transistors 1420, 1421, and 1422 are coupled to A2, A0, and A1, respectively. For an alternative embodiment, only one pull-down block of NMOS transistors may be used in NAND gate 1400.

Figure 14:
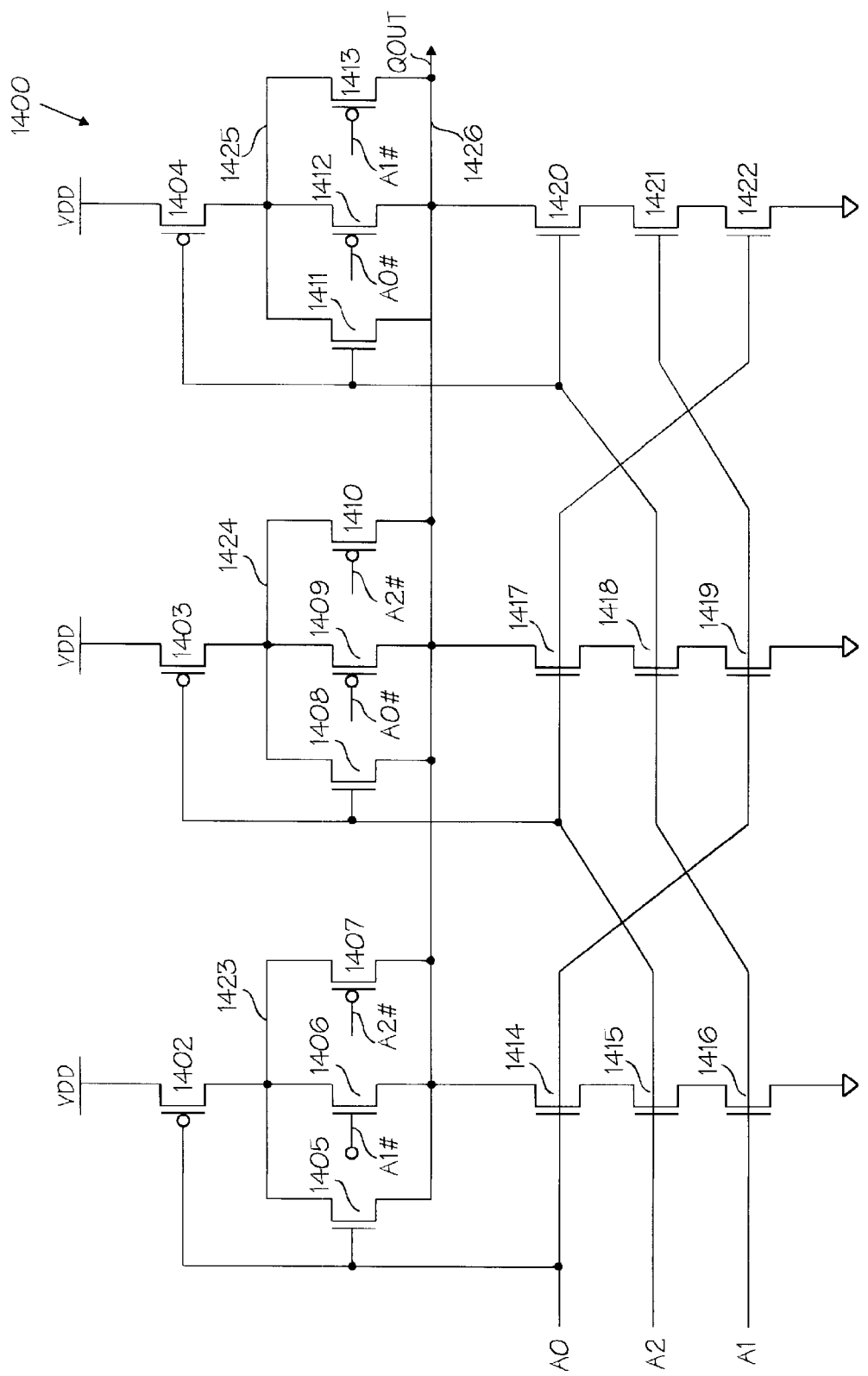
FIG. 14 is a circuit diagram of one embodiment of a three-input NAND gate according to the present invention.

Each of the NAND gates illustrated in FIGS. 10, 13, and 14 are not limited for use in decoder 804 of FIG. 8; rather, they may be used in any logic circuit of any integrated circuit.

Symmetrical predecoder 804 of FIG. 8 may also be implemented using NOR gates. Symmetrical predecoder 1500 is one exemplary symmetrical single-stage decoder that decodes two address signals A0 and A1 into four output signals Q0–Q3 as summarized in Table 3 below. Symmetrical predecoder 1500 includes inverters 1502 and 1504 that generate A0# and A1#, respectively. Symmetrical predecoder 1500 also includes four two-input NOR gates 1506, 1508, 1510, and 1512. NOR gate 1506 generates Q0 in response to A0# and A1#; NOR gate 1508 generates A1 in response to A0# and A1, NOR gate 1510 generates Q2 in response to A0 and A1#; and, NOR gate 1512 generates Q3 in response to A0 and A1.

TABLE 3

| A1 | A0 | Q3 | Q2 | Q1 | Q0 |
|----|----|----|----|----|----|
| 0  | 0  | 1  | 0  | 0  | 0  |
| 0  | 1  | 0  | 1  | 0  | 0  |
| 1  | 0  | 0  | 0  | 1  | 0  |
| 1  | 1  | 0  | 0  | 0  | 1  |

Additional inverters and NOR gates may be added to symmetrical predecoder 1500 to decode any number of address input signals as generally known in the art. For one embodiment, multi-stage or tree decoding may also be used to decode larger numbers of address signals. For another embodiment, a first decoder of NAND gates (such as illustrated in FIG. 9) may be coupled to a second decoder of NOR gates (such as illustrated in FIG. 15) that may be coupled between input buffer 802 and register 806 of FIG. 8.

NOR gates 1506, 1508, 1510, and 1512 may be symmetrical NOR gates that generate decoded signals Q0–Q3 having high-to-low slew rates that may be substantially the same regardless of whether one or more of A0 and A1 (or their complements) are high. Additionally, and/or alternatively, NOR gates 1506, 1508, 1510, and 1512 may be symmetrical NOR gates that generate decoded signals Q0–Q3 having low-to-high slew rates that may be substantially the same regardless of whether one or more of A0 or A1 (or their complements) is driven to a low logic state before the other. The output slew rates of the decoded signal Q0–Q3 may have substantially the same low-to-high slew rate as the high-to-low slew rate, or they may be different.

Figure 15:
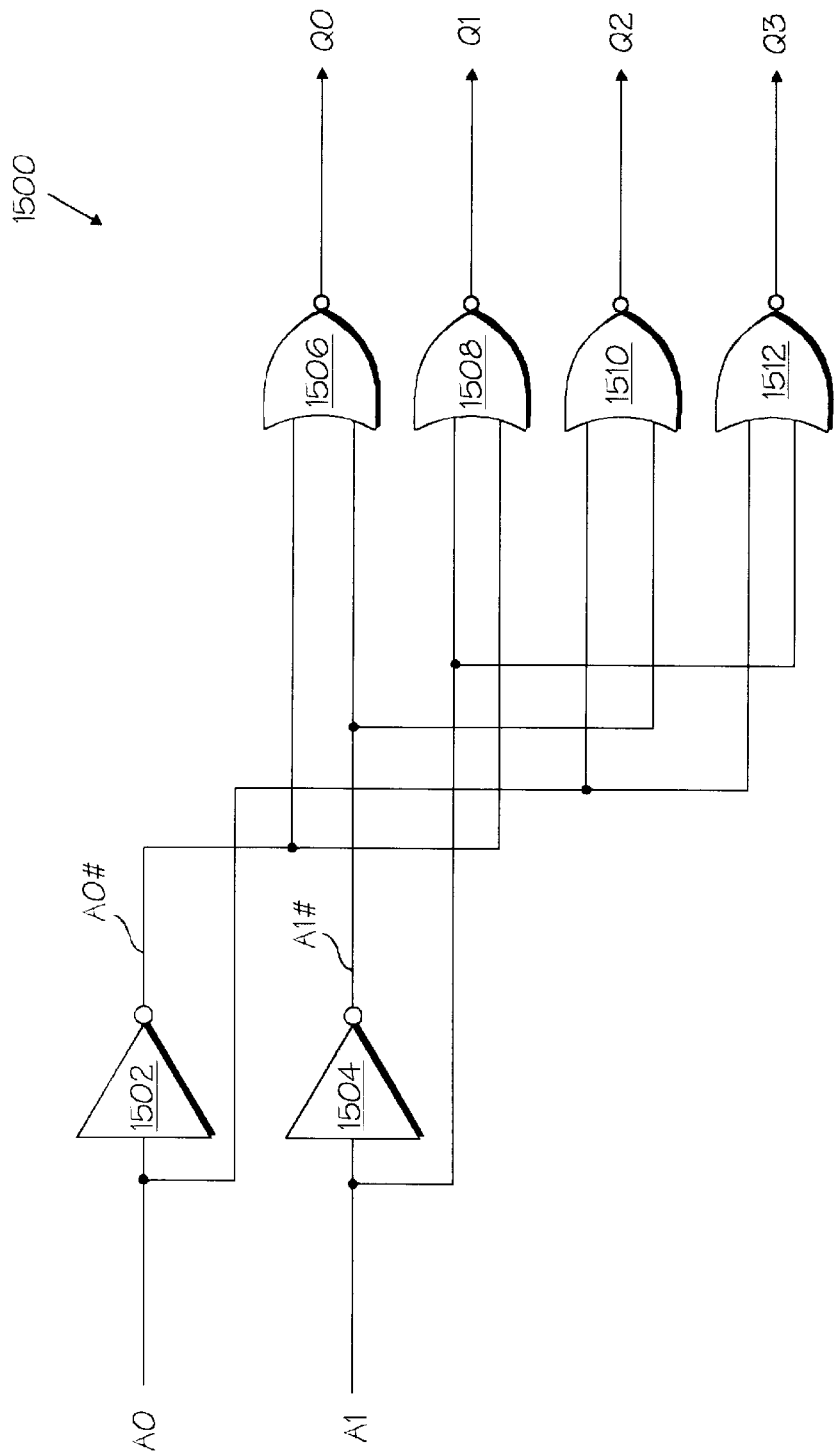
FIG. 15 is a logic diagram of another embodiment of a decoder having NOR gates.
Figure 16:
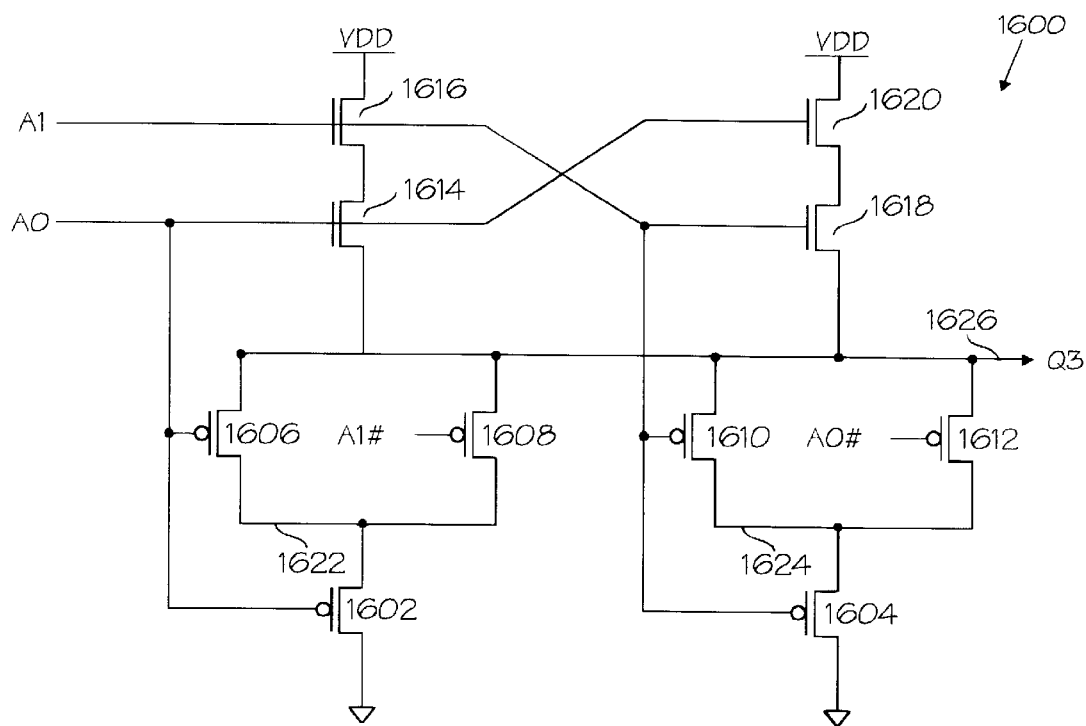
FIG. 16 is a circuit diagram of one embodiment of a two-input NOR gate according to the present invention.

FIG. 16 shows CMOS NOR gate 1600 that is one exemplary embodiment of NOR gate 1512 of FIG. 15. NOR gate 1600 may also be used for NOR gates 1506, 1508, and 1516 so as to output substantially uniform decoded signals Q0–Q3. NOR gate 1600 may also be used for any configuration of decoder 804 of FIG. 8 that uses NOR gates. NOR gate 1600 may include a pull-up circuit and a pull-down circuit.

The pull-up circuit may include a first pull-up block and a second pull-up block. The first pull-up block may include PMOS transistors 1614 and 1616 coupled in series with each other, and coupled between output line 1626 and power supply voltage VDD. PMOS transistor 1614 has its drain coupled to output line 1626, its gate coupled to A0, and its source coupled to the drain of PMOS transistor 1616. PMOS transistor 1616 has its gate coupled to A1, and its source coupled to VDD. The second pull-up block may include PMOS transistors 1618 and 1620 coupled in series with each other, and coupled between output line 1626 and VDD. PMOS transistor 1618 has its drain coupled to output line 1626, its gate coupled to A1, and its source coupled to the drain of PMOS transistor 1620. PMOS transistor 1620 has its gate coupled to A0, and its source coupled to VDD. When A1 and A0 are both low logic states (i.e., 00), the NMOS transistors are off and the PMOS transistors are on pulling Q3 high.

By sizing PMOS transistor 1614 to have approximately the same size (e.g., transistors channel lengths, widths, etc.) as PMOS transistor 1618, and by sizing PMOS transistor 1616 to have approximately the same size as PMOS transistor 1620, the pull-down circuit may provide a substantially uniform or symmetrical low-to-high output slew rate regardless of the order in which A0 or A1 transition from a high state to a low state.

Figure 17:
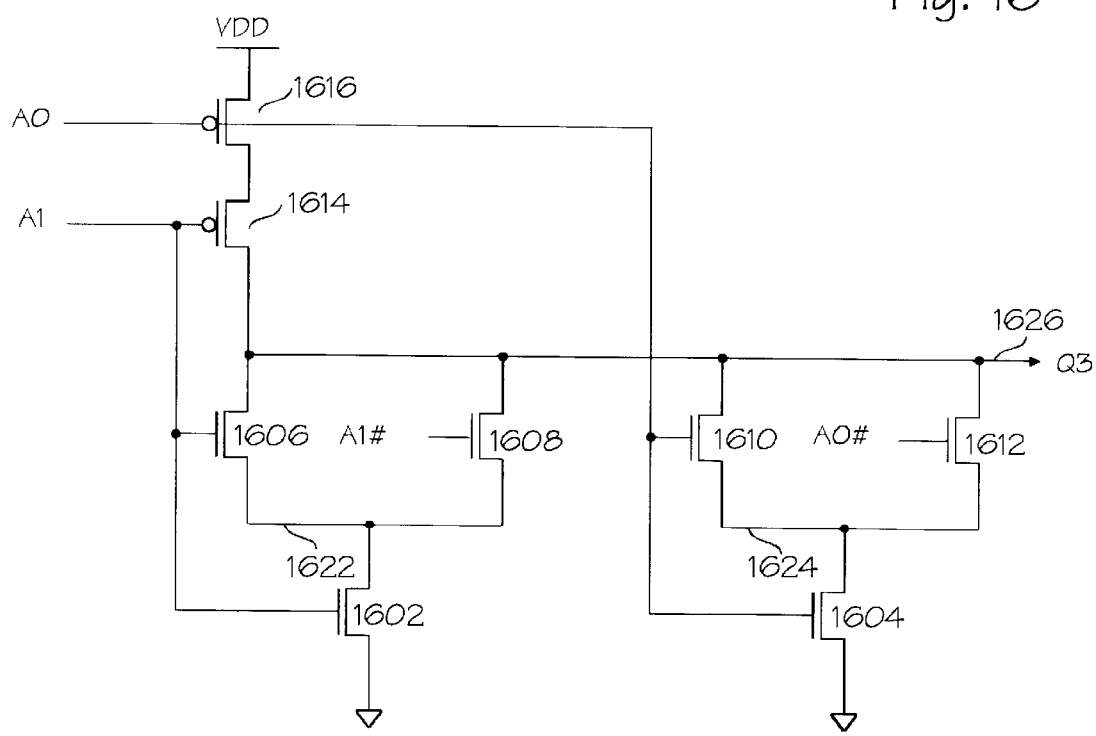
FIG. 17 is a circuit diagram of another embodiment of a two-input NOR gate according to the present invention.

For an alternative embodiment, either pull-up block of PMOS transistors may be removed. FIG. 17 illustrates a NOR gate with only the first pull-up block coupled between output line 1626 and VDD.

The pull-down circuit may include a first pull-down circuit and a second pull-down circuit. The first pull-down circuit may include NMOS transistors 1602, 1606, and 1608. NMOS transistor 1602 has its source coupled to ground, its gate coupled to input signal A0, and its drain coupled to node 1622. NMOS transistors 1606 and 1608 are coupled in parallel with each other and are coupled between node 1622 and output line 1626. NMOS transistor 1606 has its source coupled to node 1622, its gate coupled to A0, and its drain coupled to output line 1626. NMOS transistor 1608 has its source coupled to node 1622, its gated coupled to A1#, and its drain coupled to output line 1626. A ground potential of approximately zero volts may be supplied to NMOS transistors 1602 and 1604 via a conduit (e.g., diffusion regions, metal lines, etc.) as generally known in the art. The second pull-down block may include NMOS transistors 1604, 1610, and 1612. NMOS transistor 1604 has its source coupled to ground, its gate coupled to input signal A1, and its drain coupled to node 1624. NMOS transistors 1616 and 1612 are coupled in parallel with each other and are coupled between node 1624 and output line 1626. NMOS transistor 1616 has its source coupled to node 1624, its gate coupled to A1, and its drain coupled to output line 1626. NMOS transistor 1612 has its source coupled to node 1624, its gated coupled to A0#, and its drain coupled to output line 1626.

The pull-down circuit may pull Q3 down from a high logic state to a low logic state at a substantially uniform slew rate when A1 and A0 transition from 00 to 10, 01, or 11, respectively. The operation of NOR gate 1600 may be evident by examining each case in turn. In the first case: A1 and A0 transition from 00 to 01, respectively; PMOS transistors 1614 and 1620 are turned off decoupling output line 1626 from VDD; and, NMOS transistors 1602, 1606, and 1608 are turned on to pull Q3 down at a first slew rate towards ground.

In the second case: A1 and A0 transition from 00 to 10, respectively;

PMOS transistors 1616 and 1618 are turned off decoupling output line 1626 from VDD; and, NMOS transistors 1604, 1610, and 1612 are turned on to pull Q3 down at a second slew rate towards ground. The first and second slew rates may be substantially the same or uniform if, for example, NMOS transistors 1602 and 1604 are sized approximately the same (i.e., approximately the same channel lengths and widths, etc.), NMOS transistors 1606 and 1610 are sized approximately the same, and NMOS transistors 1608 and 1612 are sized approximately the same.

In the third case: A1 and A0 transition from 00 to 11, respectively; PMOS transistors 1614, 1616, 1618, and 1620 are turned off decoupling output line 1626 from VDD; and, NMOS transistors 1602, 1606, 1604, and 1610 are turned on to pull Q3 down at a third slew rate towards ground. The operation of NOR gate 1600 is summarized in Table 4.

TABLE 4

| A1 | A0 | Q3 | 1602 | 1604 | 1606 | 1608 | 1610 | 1612 | 1614 | 1616 | 1618 | 1620 |
|---|---|---|---|---|---|---|---|---|---|---|---|---|
| 0 | 0 | 1 | Off | Off | Off | On | Off | On | On | On | On | On |
| 0 | 1 | 0 | On | Off | On | On | Off | Off | Off | On | On | Off |
| 1 | 0 | 0 | Off | On | Off | Off | On | On | On | Off | Off | On |
| 1 | 1 | 0 | On | On | On | Off | On | Off | Off | Off | Off | Off |

The third slew rate may be substantially equivalent to the first and second slew rates by, for example, appropriately sizing the NMOS transistors of the pull-down circuit. As similarly described with respect to NAND gate 1000 of FIG. 10, the sizes of NMOS transistors 1602, 1604, 1606, 1608, 1610, and 1612 may be chosen to yield the same equivalent static resistance for the pull down circuit in each of the three cases. Equations 1, 2, and 3 above may also be used for NOR gate 1600 by replacing $R_{1002}$, $R_{1006}$, and $R_{1008}$ with $R_{1602}$, $R_{1606}$, and $R_{1608}$, respectively. Equation 3 may then be used to determine the static resistance of each of NMOS transistors 1602, 1606, and 1608. If each pair of NMOS transistors 1602 and 1604, 1606 and 1616, and 1608 and 1612 are sized approximately equally, Equation 3 may also be used to determine the static resistance of NMOS transistors 1604, 1610, and 1612, respectively.

While many solutions for Equation 3 may exist, for one embodiment, the ratio of channel width to channel length for NMOS transistors 1602:1606:1608 (and 1604:1610:1612) may be approximately 3:1:2. For another embodiment, the ratio of channel width to channel length for NMOS transistors 1602:1606:1608 (and 1604:1610:1612) may be approximately 2.5:1:2.5.

Thus, by appropriately sizing the NMOS transistors of the pull-down circuit of NOR gate 1600, the output signal Q3 on output line 1626 may have a substantially uniform or symmetrical high-to-low slew rate regardless of whether inputs signals A1 and A0 transition from 00 to 01, 10, or 11. The slew rate of Q3 may be set to any value by the sizes of the NMOS transistors of the pull-down circuit. For one embodiment, the slew rate of Q3 transitioning from approximately 3.3 volts to approximately zero volts is approximately 100 picoseconds to approximately 250 picoseconds, and preferably from approximately 150 picoseconds to approximately 200 picoseconds.

Thus, NOR gate 1600 may be a symmetrical NOR gate that has a substantially uniform high-to-low output slew rate regardless of the number of inputs signals that transition from a low logic state to a high logic state. Additionally, NOR gate 1600 may be a symmetrical NOR gate that has a substantially uniform low-to-high output slew rate regardless of when the inputs signals transition from a high logic state to a low logic state. The PMOS and NMOS transistors of NOR gate 1600 may also be sized to relative each other such that the low-to-high and high-to-low slew rates of Q3 are substantially equal.

The concept of NOR gate 1600 may be used in X-input CMOS NOR gates, where X>1. For each input signal that is added to the X-input NOR gate, an additional block of the pull-down circuit is added having an NMOS transistor coupled in series with a transistor circuit between ground and an output node of the NOR gate. The transistor circuit includes a group of parallel coupled transistors wherein one of the transistors is controlled by the additional input signal, and the other transistors are controlled by the complements of the remaining input signals. An additional pull-up block may also be added. The additional pull-up block may have an additional transistor coupled in series with transistors corresponding to each of the other input signals.

Figure 18:
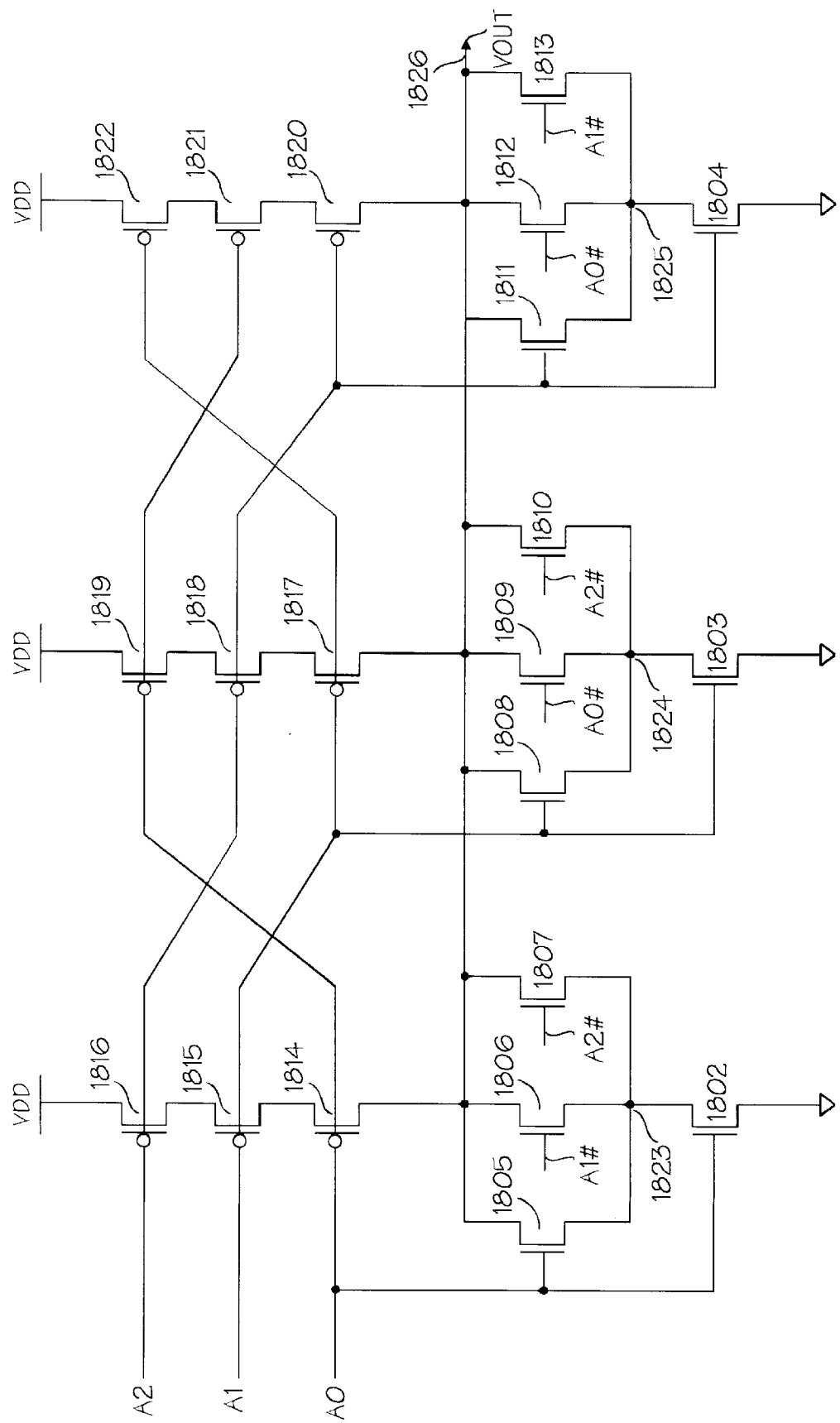
FIG. 18 is a circuit diagram of one embodiment of a three-input NOR gate according to the present invention.

An exemplary embodiment of a three-input NOR gate 1800 is illustrated in FIG. 18. NOR gate 1800 may generate an output signal QOUT having a substantially uniform low-to-high slew rate, and a substantially uniform high-to-low slew rate.

The pull-down circuit of NOR gate 1800 may include NMOS transistors 1802–1813. NMOS transistors 1802, 1803, and 1804 each have its source coupled to ground, its gate coupled to A0, A1, and A2, respectively, and its drain coupled to nodes 1823, 1824, and 1825, respectively. NMOS transistors 1805–1807 are coupled in parallel with each other and are coupled between node 1823 and output line 1826 that provides output signal QOUT. The gates of NMOS transistors 1805, 1806, and 1807 are coupled to A0, A1#, and A2#, respectively. NMOS transistors 1808–1810 are coupled in parallel with each other and are coupled between node 1824 and output line 1826. The gates of NMOS transistors 1808, 1809, and 1810 are coupled to A1, A0#, and A2#, respectively. NMOS transistors 1811–1813 are coupled in parallel with each other and are coupled between node 1825 and output line 1826. The gates of NMOS transistors 1811, 1812, and 1813 are coupled to A2, A0#, and A1#, respectively.

The pull-up circuit of NOR gate 1800 may include PMOS transistors 1818–1822. PMOS transistors 1814–1816 are coupled in series with each other and are coupled between output line 1826 and VDD. The gates of PMOS transistors 1814, 1815, and 1816 are coupled to A0, A1, and A2, respectively. PMOS transistors 1817–1819 are coupled in series with each other and are coupled between output line 1826 and VDD. The gates of PMOS transistors 1817, 1818, and 1819 are coupled to A1, A2, and A0, respectively. PMOS transistors 1820–1822 are coupled in series with each other and are coupled between output line 1826 and VDD. The gates of PMOS transistors 1820, 1821, and 1822 are coupled to A2, A0, and A1, respectively. For an alternative embodiment, only one pull-up block of PMOS transistors may be used in NOR gate 1800.

Each of the NOR gates illustrated in FIGS. 16, 17, and 18 are not limited to use in decoder 804 of FIG. 8; rather, they may be used in any logic circuit of any integrated circuit.

With respect to symmetrical predecoder 900 of FIG. 9, it may be advantageous for A0, A0#, A1, and A1# to be provided to NAND gates 906–912 at approximately the same time. Because each of inverters 902 and 904 have a characteristic delay time required to generate complement signals A0# and A1#, NAND gates 906–912 may not each receive their inputs signals at approximately the same time. NAND gate 906 may receive A0# and A1# later than NAND gates 908 and 910 receive A1 and A0. NAND gates 908 and 910 may receive A0# and A1# later than NAND gate 912 receives A0 and A1. One method of addressing this situation is to provide an additional delay in the path of A0 and A1 to compensate for the delay of inverters 902 and 904. For one embodiment, the signal lines carrying A0 and A1 may be routed to include additional lengths. For another embodiment, resistors and/or capacitors may be introduced into the signal path of A0 and A1. For still another embodiment, inverting or non-inverting buffers may be introduced in the signal paths to compensate for the delay of inverters 902 and 904.

For yet another embodiment, the speed of NAND gates 906 and 912 may be adjusted to compensate for the delay of inverters 902 and 904. The speed of NAND gates 906–912 may be adjusted by adjusting the sizes of the transistors that are used to construct each NAND gate as generally known in the art. For one example, the speed of NAND gate 906 may be increased to approximately match the speed of NAND gate 906 or 908 plus the characteristic delay of inverter 902 or 904. That is, the delay through NAND gate 906 may approximately equal the delay through NAND gate 906 or 908 plus the delay through inverter 902 or 904. For one embodiment, the transistors that are used to construct NAND gate 906 may be increased by approximately 20 to 50 percent over the corresponding transistors that are used to construct NAND gates 906 or 908. Additionally, and/or alternatively, the speed of NAND gate 912 may be decreased to approximately match the speed of NAND gate 906 or 908 plus the characteristic delay of inverters 902 and 904. That is, the delay through NAND gate 912 may approximately equal the delay through NAND gate 906 or 908 plus the delay through inverter 902 or 904. For one embodiment, the transistors that are used to construct NAND gate 912 may be decreased by approximately 20 to 50 percent over the corresponding transistors that are used to construct NAND gates 906 or 908.

These methods may ensure that the decoded signals Q0–Q3 will be generated at approximately the same time regardless of the logic states of A0 and A1. Similar means may be employed in the symmetrical predecoder 1500 of FIG. 15.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A NAND gate comprising:
   a pull-down circuit; and
   a pull-up circuit coupled to the pull-down circuit, the pull-up circuit configured to receive at least two input signals and drive an output signal at a substantially uniform slew rate from a low logic state to a high logic state irrespective of whether one of the input signals transitions to a low logic state, or both of the input signals transition to low logic state.

2. A NAND gate comprising:
   a pull-down circuit; and
   a pull-up circuit coupled to the pull-down circuit, the pull-up circuit configured to receive at least two input signals and drive an output signal at a substantially uniform slew rate when at least one of the input signals transitions to a low logic state, wherein the pull-up circuit comprises:
   a plurality of load circuits each coupled to a corresponding one of the plurality of input signals; and
   a plurality of transistor circuits coupled to the plurality of load circuits, each transistor circuit comprising a plurality of transistors coupled in parallel with each other and coupled to a corresponding one of the input signals or a complement of a corresponding one of the input signals.

3. The NAND gate of claim 2, wherein the plurality of load circuits each comprise a p-channel MOS transistor, and the plurality of transistors each comprise a p-channel MOS transistor.

4. The NAND gate of claim 1 wherein the pull-up circuit comprises:
   a first p-channel MOS transistor having a source coupled to a power supply conduit, a drain coupled to a first node, and a gate coupled to a first input signal;
   a second p-channel MOS transistor having a source coupled to the first node, a drain coupled to an output of the NAND gate, and a gate coupled to the first input signal;
   a third p-channel MOS transistor having a source coupled to the first node, a drain coupled to the output of the NAND gate, and a gate coupled to a complement of a second input signal;
   a fourth p-channel MOS transistor having a source coupled to the power supply conduit, a drain coupled to a second node, and a gate coupled to the second input signal;
   a fifth p-channel MOS transistor having a source coupled to the second node, a drain coupled to the output of the NAND gate, and a gate coupled to the second input signal; and
   a sixth p-channel MOS transistor having a source coupled to the second node, a drain coupled to the output of the NAND gate, and a gate coupled to a complement of the first input signal.

5. The NAND gate of claim 2, wherein the pull-down circuit comprises a first plurality of transistors coupled in series with each other and each configured to receive a corresponding one of the input signals.

6. The NAND gate of claim 5, wherein the pull-down circuit further comprises a second plurality of transistors coupled in series with each other and coupled in parallel with the first plurality of transistors, the second plurality of transistors each configured to receive a corresponding one of the input signals.

7. The NAND gate of claim 6, wherein the first plurality of transistors and the second plurality of transistors each comprise a n-channel MOS transistor.

8. A decoder comprising:
   a plurality of inputs; and
   a plurality of NAND circuits coupled to the plurality of inputs and each comprising the NAND gate of claim 2, the plurality of NAND circuits generating a plurality of decoded signals.

9. A system comprising:
   the decoder of claim 8; and
   a clocked storage element coupled to the decoder and for storing the decoded address.

10. A NAND circuit comprising:
    a pull-down circuit; and
    a pull-up circuit including:
    a first transistor coupled to a first input;
    a second transistor coupled to the first transistor, the first input, and an output of the NAND circuit;
    a third transistor coupled to the first and second transistors, the output, and a second input;
    a fourth transistor coupled to a third input;
    a fifth transistor coupled to the fourth transistor, the third input, and the output; and a sixth transistor coupled to the fourth and fifth transistors, the output, and a fourth input.

11. The NAND gate of claim 10, wherein the first, second, third, fourth, fifth, and sixth transistors are p-channel transistors.

12. The NAND gate of claim 11, wherein:

the first transistor has a source coupled to a power supply conduit, a drain coupled to a first node, and a gate coupled to the first input;

the second transistor has a source coupled to the first node, a drain coupled to the output, and a gate coupled to the first input;

the third transistor has a source coupled to the first node, a drain coupled to the output, and a gate coupled to the second input;

the fourth transistor has a source coupled to the power supply conduit, a drain coupled to a second node, and a gate coupled to the third input;

the fifth transistor has a source coupled to the second node, a drain coupled to the output, and a gate coupled to the third input; and the sixth transistor has a source coupled to the second node, a drain coupled to the output, and a gate coupled to the fourth input.

13. The NAND gate of claim 10, wherein the pull-down circuit comprises:

a seventh transistor coupled to the first input and the output; and an eighth transistor coupled in series with the seventh transistor and coupled to the second input.

14. The NAND gate of claim 13, wherein the pull-down circuit further comprises:

a ninth transistor coupled to the second input and the output; and a tenth transistor coupled in series with the ninth transistor and coupled to the first input.

15. A decoder comprising:

a plurality of inputs; and a plurality of NAND circuits coupled to the plurality of inputs and each comprising the NAND circuit of claim 10, the plurality of NAND circuits generating a plurality of decoded signals.

16. A system comprising:

the decoder of claim 15; and a clocked storage element coupled to the decoder and for storing the decoded address.

17. A decoder comprising:

a plurality of inputs configured to receive a plurality of input signals; and a plurality of NAND gates coupled to the plurality of inputs and each comprising the NAND gate of claim 1, the plurality of NAND gates generating a plurality of decoded signals in a substantially uniform amount of time regardless of the logic states of the plurality of input signals.

18. The decoder of claim 17, wherein the decoder further comprises:

a first inverter configured to receive a first input signal and generate, in a first amount of time, a first inverted signal that is the complement of the first input signal; and a second inverter configured to receive a second input signal and generate, in a second amount of time, a second inverted signal that is the complement of the second input signal, wherein the plurality of NAND gates generate the plurality of decoded signal in response to the first input signal, the first inverted signal, the second input signal, and the second inverted signal.

19. The decoder of claim 18, wherein the plurality of NAND gates comprise:

a first NAND gate configured to receive the first signal and the second signal, the first NAND gate configured to perform a first logic function in a third amount of time;

a second NAND gate configured to receive the first signal and the second inverted signal, the second NAND gate configured to perform a second logic function in a fourth amount of time;

a third NAND gate configured to receive the first inverted signal and the second signal, the third NAND gate configured to perform a third logic function in a fifth amount of time; and a fourth NAND gate configured to receive the first inverted signal and the second inverted signal, the fourth NAND gate configured to perform a fourth logic function in a sixth amount of time.

20. The decoder of claim 19, wherein the third amount of time is approximately equal to the fourth or fifth amount of time plus the first or second amount of time.

21. The decoder of claim 20 wherein the sixth amount of time is approximately equal to the fourth or fifth amount of time plus the first or second amount of time.

22. The decoder of claim 8, wherein the decoder further comprises:

a first inverter configured to receive a first input signal and generate, in a first amount of time, a first inverted signal that is the complement of the first input signal; and a second inverter configured to receive a second input signal and generate, in a second amount of time, a second inverted signal that is the complement of the second input signal, wherein the plurality of NAND gates generate the plurality of decoded signal in response to the first input signal, the first inverted signal, the second input signal, and the second inverted signal.

23. The decoder of claim 22, wherein the plurality of NAND gates comprise:

a first NAND gate configured to receive the first signal and the second signal, the first NAND gate configured to perform a first logic function in a third amount of time;

a second NAND gate configured to receive the first signal and the second inverted signal, the second NAND gate configured to perform a second logic function in a fourth amount of time;

a third NAND gate configured to receive the first inverted signal and the second signal, the third NAND gate configured to perform a third logic function in a fifth amount of time; and a fourth NAND gate configured to receive the first inverted signal and the second inverted signal, the fourth NAND gate configured to perform a fourth logic function in a sixth amount of time.

* * * * *